US 6,984,560 B2

(12) United States Patent
Ko

(10) Patent No.: US 6,984,560 B2
(45) Date of Patent: Jan. 10, 2006

(54) METHODS OF FORMING QUANTUM DOTS IN SEMICONDUCTOR DEVICES

(75) Inventor: Kwan Joo Ko, Gyeonggi-do (KR)

(73) Assignee: DongbuAnam Semiconductor, Inc., Seoul (KR)

( * ) Notice: Subject to any disclaimer, the term of this patent is extended or adjusted under 35 U.S.C. 154(b) by 0 days.

(21) Appl. No.: 10/750,249

(22) Filed: Dec. 31, 2003

(65) Prior Publication Data

US 2005/0003620 A1    Jan. 6, 2005

(30) Foreign Application Priority Data

Jul. 2, 2003    (KR) ............... 10-2003-0044450

(51) Int. Cl.
 *H01L 21/336*    (2006.01)
(52) U.S. Cl. .................. 438/257; 438/509; 438/962
(58) Field of Classification Search ............ 438/257, 438/478, 503, 509, 543, 686, 962

See application file for complete search history.

(56) References Cited

U.S. PATENT DOCUMENTS

| 5,347,140 | A | * | 9/1994 | Hirai et al. ............... 257/17 |
| 5,731,598 | A | | 3/1998 | Kado et al. .............. 257/30 |
| 6,060,743 | A | | 5/2000 | Sugiyama et al. ........ 257/321 |
| 6,090,666 | A | | 7/2000 | Ueda et al. ............... 438/257 |
| 6,118,686 | A | | 9/2000 | Taira et al. ............... 365/129 |
| 6,130,143 | A | * | 10/2000 | Westwater et al. ......... 438/478 |
| 6,597,036 | B1 | | 7/2003 | Lee et al. ................. 257/316 |
| 6,734,105 | B2 | | 5/2004 | Kim |
| 6,767,771 | B2 | * | 7/2004 | Kim ........................ 438/142 |

* cited by examiner

*Primary Examiner*—Phuc T. Dang
(74) *Attorney, Agent, or Firm*—Hanley, Flight & Zimmerman, LLC

(57) ABSTRACT

Methods of forming quantum dots in semiconductor devices are disclosed. One example method includes adsorbing metal clusters on a silicon substrate by controlling density thereof, growing silicon by heating the substrate on which the metal clusters are adsorbed, and removing the metal clusters. The example method further includes forming a silicon oxide layer on the substrate and depositing polysilicon on the oxide layer and patterning the polysilicon and the oxide layer.

13 Claims, 4 Drawing Sheets

METHODS OF FORMING QUANTUM DOTS IN SEMICONDUCTOR DEVICES

TECHNICAL FIELD

The present disclosure relates to semiconductor devices and, more particularly, to methods of forming quantum dots in semiconductor devices.

BACKGROUND

Semiconductor devices are developing rapidly due to the fast spread of information through media such as computers. Semiconductor devices are functionally required not only to operate with high speed, but also to have mass storage capacity. To meet these requirements, fabrication technology of semiconductor devices is developing to enhance integration, reliability, and response speed of semiconductor devices.

In case of Dynamic Random Access Memory (DRAM), 64 gigabyte (GB) DRAM with design rule of about 70 nanometers (nm) and 1 terabyte (TB) DRAM with design rule of about 35 nm will be developed by around the years of 2008 and 2014, respectively.

However, the 64 GB DRAM or 1 TB DRAM is not easy to fabricate using conventional methods such as optical lithography or chemical vapor deposition. Therefore, research for new fabrication methods are in progress.

A new technology using an electron beam or X-ray is being developed to replace the conventional photolithography technology. In addition, an atomic layer deposition method is being developed to replace the conventional methods for forming layers. Furthermore, research on semiconductor devices having quantum dots with sizes on the order of nanometers, which is applicable to a single-electron gate, are also in progress.

Examples of the semiconductor device with quantum dots and fabrication methods thereof are disclosed in U.S. Pat. No. 5,731,598 to Kado et al.; U.S. Pat. No. 6,060,743 to Sugiyama et al.; U.S. Pat. No. 6,090,666 to Ueda et al.; and U.S. Pat. No. 6,118,686 to Taira et al.

The fabrication method of quantum dots in development may be represented by a method using a Focused Ion Beam (FIB) or electron beam that forms a quantum dot by inserting more than one ion or one electron in a desired location using the FIB or electron beam. Using the FIB method, it is favorable to control the size and the location of formation of a quantum dot. One significant drawback to the FIB method is that the method has the limitation in commercial use because of low productivity.

U.S. Pat. No. 5,731,598 to Kado et al. discloses a single-electron tunnel device. To fabricate a single-electron device of a multiple junction structure operating at room temperature, metal and semiconductor clusters of several tens of nanometers are deposited to form causally quantum dots of several tens of nanometers. However, due to the casual formation of the multiple junction structure, size of a device cannot be reduced and efficiency of the fabrication is decreased consequently.

U.S. Pat. No. 6,090,666 to Ueda et al. discloses a method of forming crystal nuclei. In such a method, an amorphous thin layer is formed and a thermal processing is then performed for the thin layer to form a mono crystal. Subsequently, the mono crystal is formed as a quantum dot. The method is more favorable in view of productivity than the method taught by Kado et al., but has difficulty in controlling the size and the distribution of the quantum dots.

To fabricate a nano-device with a quantum dot, it is important to form the quantum dot with a crystal feature of single crystal level to form a fine and uniform quantum dot.

Consequently, a new method for forming a quantum dot, which can control the size and the distribution of the quantum dot easily and can also be employed commercially, is required.

DETAILED DESCRIPTION

As disclosed herein, an example method is used to form quantum dots in a semiconductor device. The example method of forming quantum dots in a semiconductor device results in fine and uniform quantum dots of several tens of nanometers using metal nano-clusters.

One example method of forming quantum dots in a semiconductor device includes adsorbing metal clusters on a silicon substrate by controlling density thereof, growing silicon by heating the substrate on which the metal clusters are adsorbed, and removing the metal clusters. The example method may further include forming a silicon oxide layer on the substrate and depositing polysilicon on the oxide layer and patterning the polysilicon and the oxide layer.

Figure 3A:
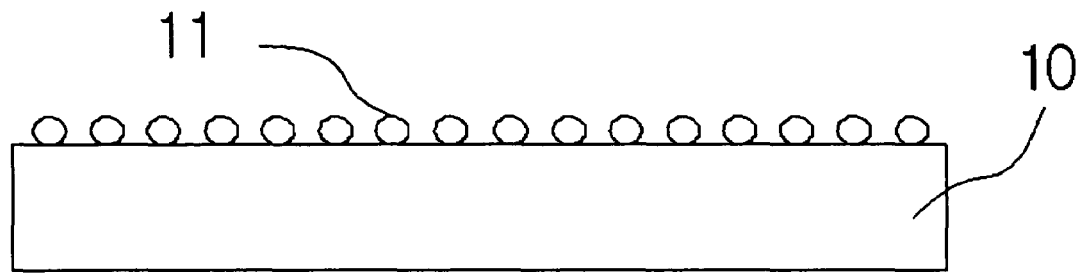
FIGS. 3a through 3f illustrate, in cross-sectional views, the results of various processes of an example method of forming quantum dots.

In particular, referring to FIG. 3a, metal clusters 11 with predetermined distribution of size are adsorbed on the substrate 10 by controlling the density of the metal clusters. According to one example, precious metal such as gold, silver, or transition metals are used for the metal clusters. In one example, the size of the metal clusters is between about 5 and 50 nm.

There are several methods that may be used to form metallic nano-clusters. For example, forming a nano-cluster by thermal processing after deposition on the surface and adsorbing a metal cluster of uniform size on the surface, wherein the surface of the metal cluster is in an inactivated state owing to organic ligands.

Figure 3B:
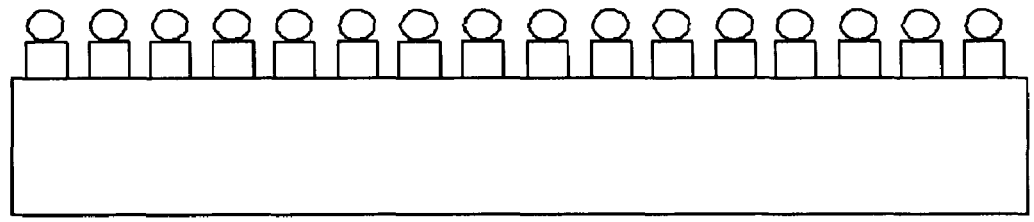

Referring to FIG. 3b, if silicon is grown by Chemical Vapor Deposition (CVD) at the same time by heating the substrate on which the metal cluster is adsorbed, a silicon chemical gas comes in contact with the metal cluster and silicon melts selectively. Then, the silicon condenses and grows only between the metal cluster and the silicon substrate and nano-line of the silicon is formed vertically on the surface. At this time, the metal cluster is used as a catalyst for the melt, condensation, and growth of the silicon.

Figure 3C:
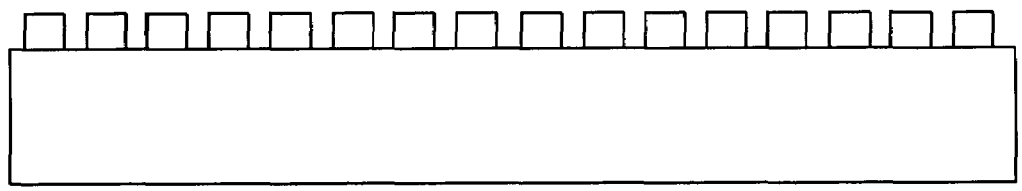

FIG. 3c is a cross-sectional view of the results of a process in which the metal clusters are removed from the silicon formed on the surface. The metal cluster can be removed by wet etching or dry etching.

Figure 3D:
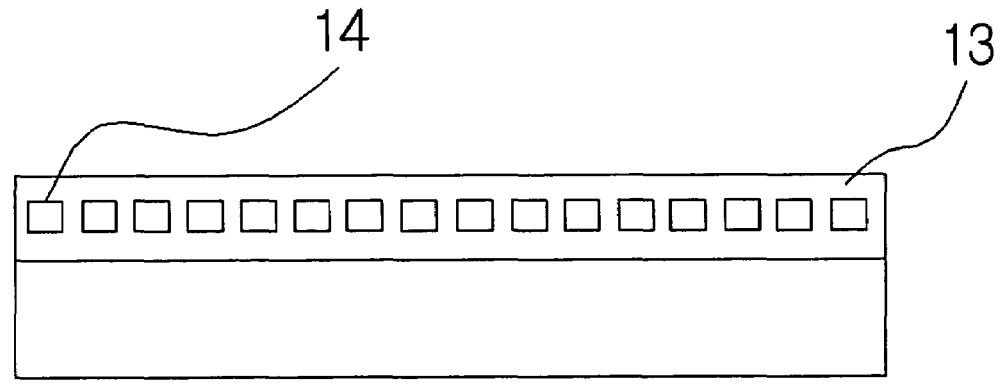

FIG. 3d is a cross-sectional view of the results of a process in which a silicon oxide layer 13 is formed. The silicon oxide layer may be formed by a thermal oxidation method using oxygen ($O_2$) gas or nitrous oxide (NO) gas at a temperature between about 800 and 1000° C.

The oxide layer made by the above thermal oxidation method is used as a tunneling oxide layer. A quantum dot of a single crystal 14 can be created by the thermal oxidation as in FIG. 3d because the silicon grows simultaneously towards the upside and the downside of the surface of the silicon.

Figure 1:
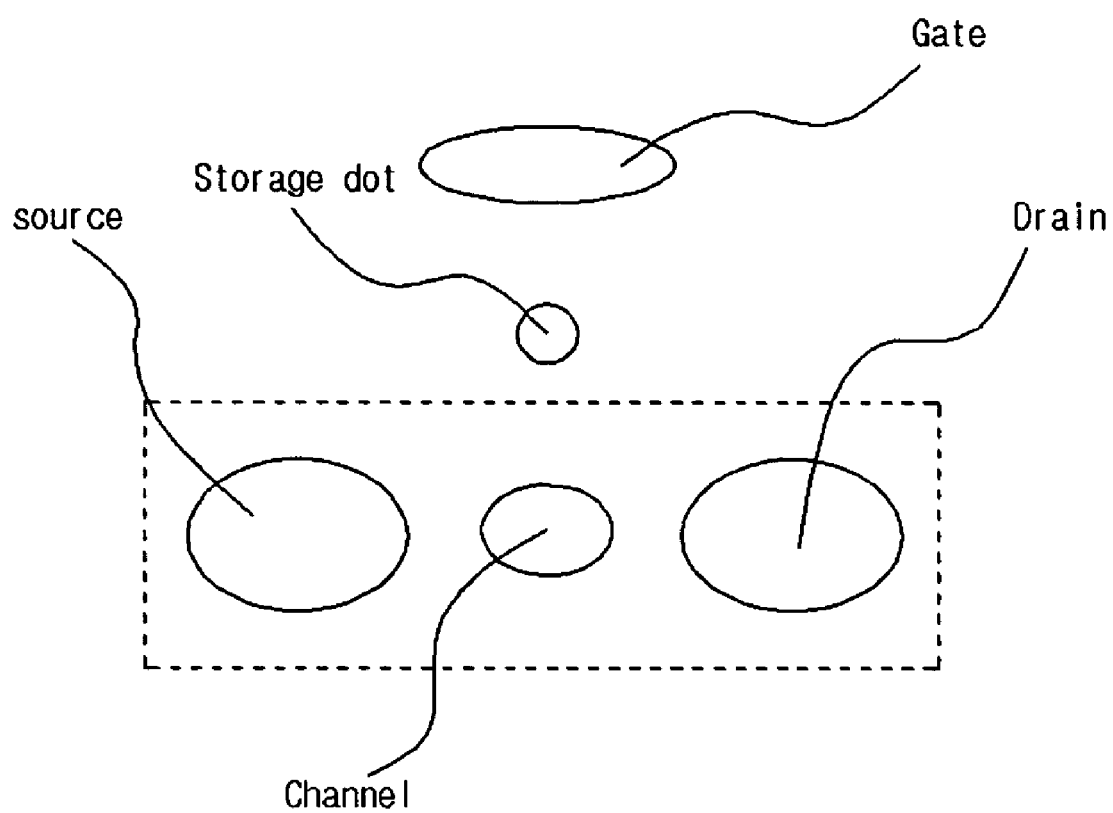
FIG. 1 illustrates concept of a semiconductor device having a quantum dot.

As a form of an island positioned in the channel like FIG. 1, the quantum dot stores an electron or causes F—N tunneling of an electron through the channel with the control gate when a current moves from the source to the drain.

Figure 2:
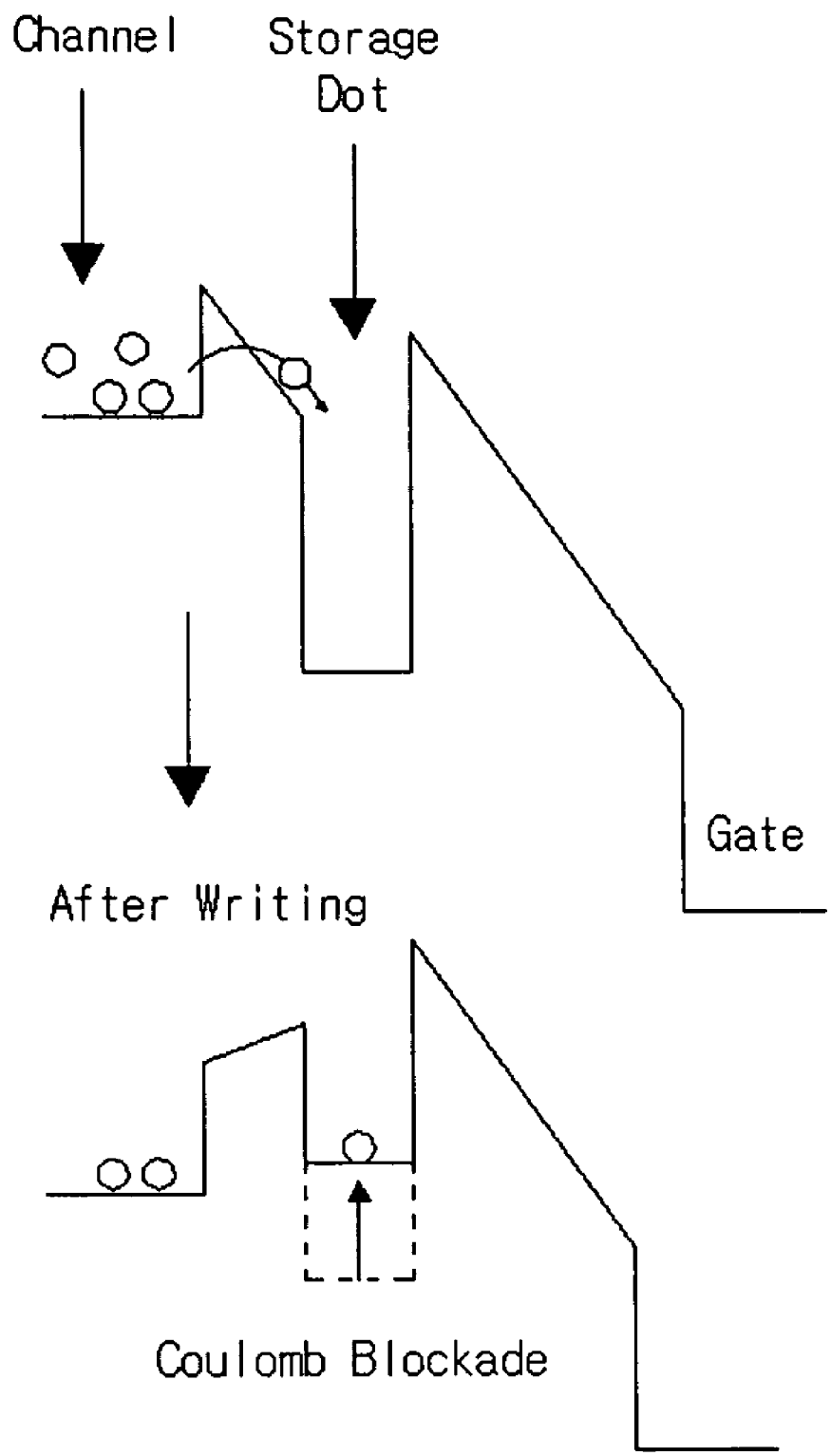
FIG. 2 is a scheme for movement of electrons existing in a channel in writing.

Referring to FIG. 2, electrons existing on the channel are stored in the quantum dot by jumping the energy barrier on writing and Coulomb blockade occurs after writing.

Figure 3E:
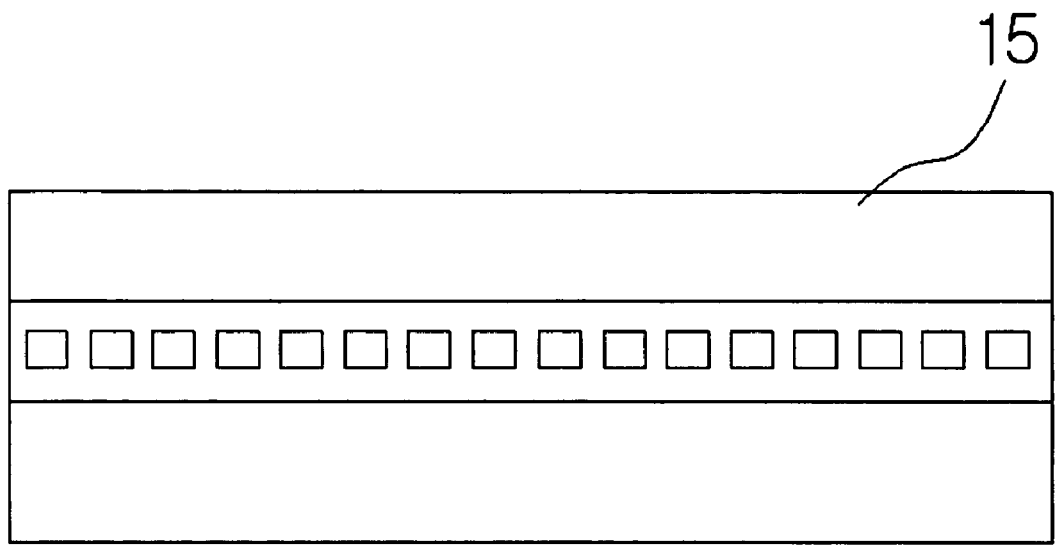

FIG. 3e illustrates a cross-sectional view of the results of a process in which polysilicon 15 is deposited. The polysilicon is deposited on the substrate with the oxide layer formed thereon and is used as a control gate.

Figure 3F:
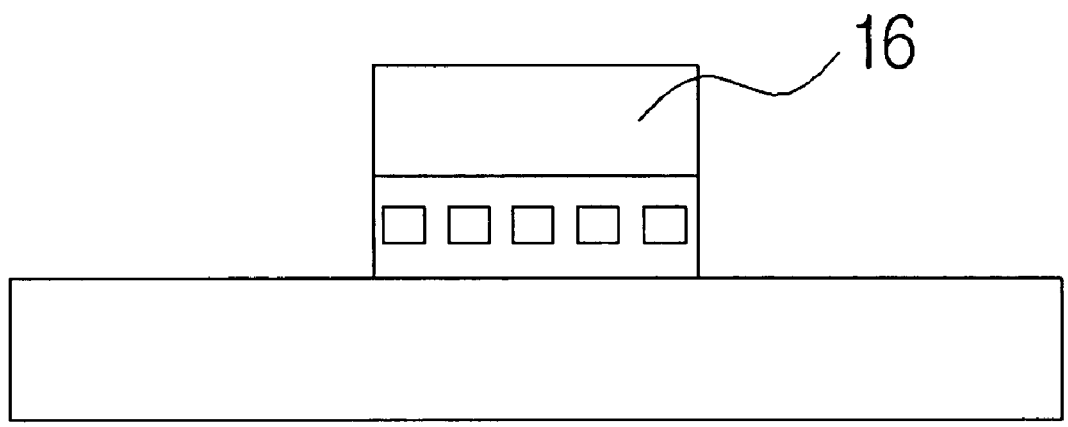

FIG. 3f illustrates a cross-sectional view of the results of a process in which the polysilicon and the oxide layers are etched. As the polysilicon is etched according to channel length and the oxide layer is sequentially removed, a quantum dot transistor is formed.

Thus, the disclosed method for forming quantum dots in a semiconductor device forms fine and uniform quantum dots of several tens of nanometers regularly through the use of metal nano-clusters.

Although certain example methods are disclosed herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of forming quantum dots in a semiconductor device, the method comprising:
   adsorbing metal clusters on a silicon substrate by controlling density thereof;
   growing silicon by heating the substrate on which the metal clusters are adsorbed;
   removing the metal clusters;
   forming a silicon oxide layer on the substrate by performing thermal oxidation, wherein the thermal oxidation uses $O_2$ gas or NO gas at a temperature of about 800 to 1000° C.; and
   depositing polysilicon on the oxide layer and patterning the polysilicon and the oxide layer.

2. A method as defined by claim 1, wherein a metal of the metal clusters is selected from the group consisting of gold, silver, and a transition metal.

3. A method as defined by claim 1, wherein the silicon is grown by chemical vapor deposition (CVD) method using the metal clusters as a mask.

4. A method as defined by claim 1, wherein the silicon condenses and grows only between the metal clusters and the silicon substrate and nano-line of the silicon is formed vertically on the surface.

5. A method as defined by claim 1, wherein the size of the metal clusters is between about 5 and 50 nanometers.

6. A method as defined by claim 1, wherein the size of the metal clusters is between about 6 and 50 nanometers.

7. A method of forming quantum dots in a semiconductor device, the method comprising:
   adsorbing metal clusters on a silicon substrate by controlling density thereof;
   growing silicon by chemical vapor deposition (CVD) using the metal clusters as a mask and hearing the substrate on which the metal clusters are adsorbed;
   removing the metal clusters;
   forming a silicon oxide layer on the substrate; and
   depositing polysilicon on the oxide layer and patterning the polysilicon and the oxide layer.

8. A method as defined by claim 7, wherein a metal of the metal clusters is selected from the group consisting of gold, silver, and a transition metal.

9. A method as defined by claim 7, wherein the silicon condenses and grows only between the metal clusters and the silicon substrate and nano-line of the silicon is formed vertically on the surface.

10. A method as defined by claim 7, wherein the size of the metal clusters is between about 5 and 50 nanometers.

11. A method as defined by claim 7, wherein the silicon oxide layer is formed by thermal oxidation method.

12. A method as defined by claim 11, wherein the thermal oxidation method uses $O_2$ gas or NO gas at a temperature of about 800 to 1000° C.

13. A method as defined by claim 7, wherein the size of the metal clusters is between about 6 and 50 nanometers.

* * * * *